(12) United States Patent
Yasuda

(10) Patent No.: US 10,250,221 B2
(45) Date of Patent: Apr. 2, 2019

(54) ELASTIC WAVE DEVICE

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 298 days.

(21) Appl. No.: 15/172,267

(22) Filed: Jun. 3, 2016

(65) Prior Publication Data

US 2016/0380613 A1    Dec. 29, 2016

(30) Foreign Application Priority Data

Jun. 24, 2015  (JP) ................................ 2015-126491

(51) Int. Cl.
    *H03H 9/02*    (2006.01)
(52) U.S. Cl.
    CPC .... *H03H 9/02992* (2013.01); *H03H 9/02543* (2013.01)
(58) Field of Classification Search
    CPC ....................... H03H 9/02535; H03H 9/02543
    USPC ...... 310/313 R, 313 A, 313 B, 313 C, 313 D
    See application file for complete search history.

(56) References Cited

U.S. PATENT DOCUMENTS

| 5,684,437 | A  | * | 11/1997 | Ago .................. H03H 9/02653 |
|           |    |   |         | 310/313 R                          |
| 6,919,777 | B2 |   | 7/2005  | Taniguchi et al.                   |

| 2005/0151602 | A1 | 7/2005  | Hattanda et al. |
| 2007/0229191 | A1 | 10/2007 | Yamaki et al.   |
| 2013/0335171 | A1 | 12/2013 | Yamato et al.   |
| 2014/0368296 | A1 | 12/2014 | Nishizawa       |
| 2015/0194947 | A1 | 7/2015  | Inate           |
| 2016/0149554 | A1 | 5/2016  | Nakagawa        |
| 2016/0156334 | A1 | 6/2016  | Nakagawa        |

FOREIGN PATENT DOCUMENTS

| CN | 103415995   A | 11/2013 |
| JP | 2000-059165 A | 2/2000  |
| JP | 2001-257555 A | 9/2001  |

(Continued)

OTHER PUBLICATIONS

Official Communication issued in corresponding Japanese Patent Application No. 2015-126491, dated Nov. 7, 2017.

*Primary Examiner* — Derek J Rosenau

(74) *Attorney, Agent, or Firm* — Keating & Bennett, LLP

(57) ABSTRACT

An elastic wave device includes a piezoelectric substrate, first and second IDT electrodes on a first main surface, and electrode lands each connected to one of the first and second IDT electrodes. First and second side portions extend in a direction perpendicular or substantially perpendicular to a polarization axis direction and to a direction normal to the piezoelectric substrate. The length of the piezoelectric substrate along the polarization axis direction at the first side portion is shorter than that at the second side portion. The first IDT electrode is closer to the first side portion than the second IDT electrode. The electrode lands include a first electrode land connected to the first busbar of the first IDT electrode without having the second IDT electrode interposed therebetween, and a second electrode land being at the same potential as the first busbar of the first IDT electrode.

15 Claims, 4 Drawing Sheets

(56) References Cited

FOREIGN PATENT DOCUMENTS

| | | |
|---|---|---|
| JP | 2002-324864 A | 11/2002 |
| JP | 2005-203889 A | 7/2005 |
| JP | 2007-274272 A | 10/2007 |
| JP | 2013-143704 A | 7/2013 |
| JP | 2014-017537 A | 1/2014 |
| JP | 2015-002511 A | 1/2015 |
| WO | 2014/050450 A1 | 4/2014 |
| WO | 2015/033891 A1 | 3/2015 |
| WO | 2015/033892 A1 | 3/2015 |

* cited by examiner

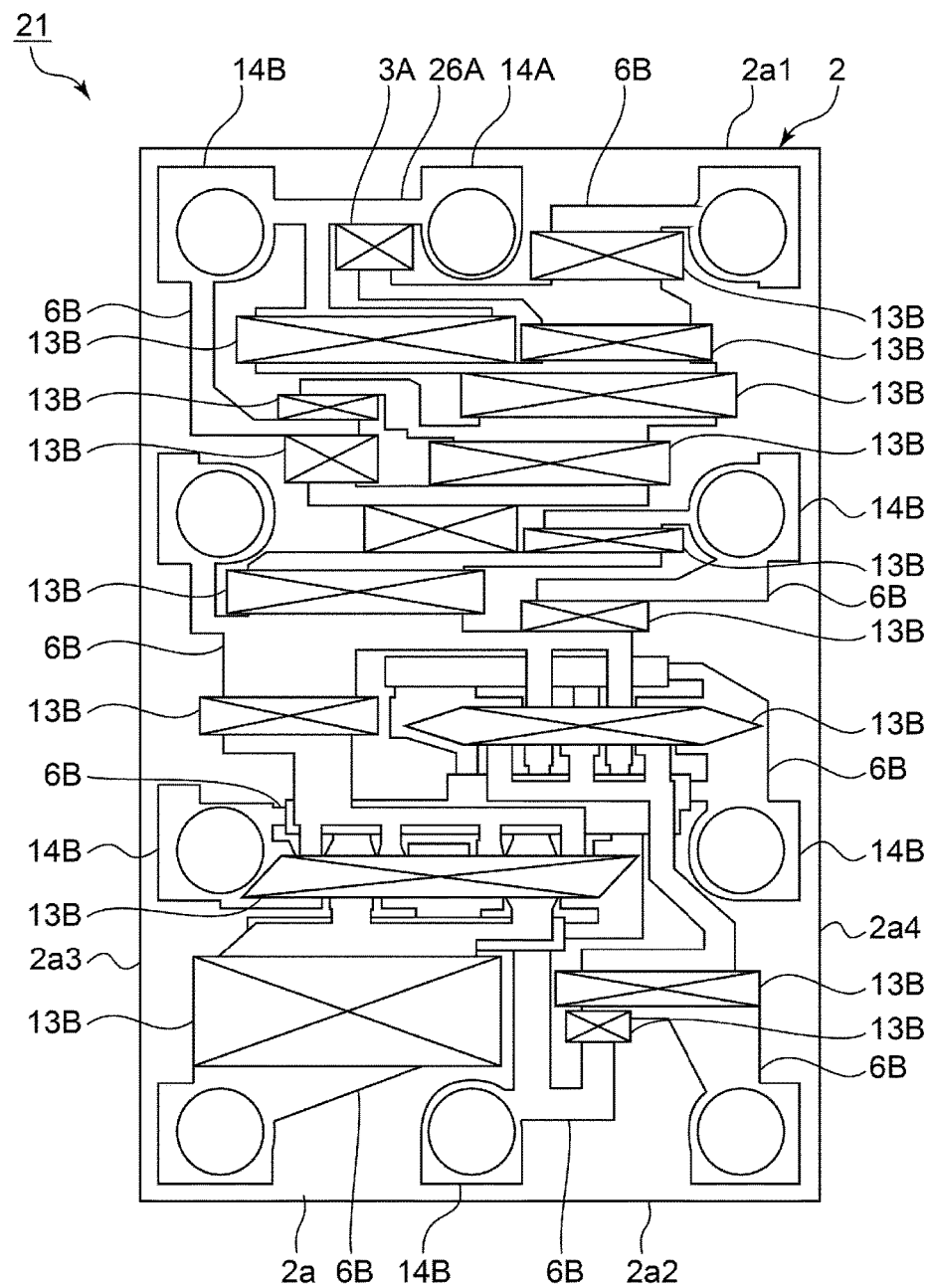

ELASTIC WAVE DEVICE

BACKGROUND OF THE INVENTION

1. Field of the Invention

The present invention relates to an elastic wave device.

2. Description of the Related Art

Elastic wave devices are widely used, for example, in cellular phones. For example, Japanese Unexamined Patent Application Publication No. 2015-002511 discloses an elastic wave device having interdigital transducer (IDT) electrodes. Plural pads are disposed along side portions of one main surface of a piezoelectric substrate of the elastic wave device.

In the piezoelectric substrate of the elastic wave device disclosed in Japanese Unexamined Patent Application Publication No. 2015-002511, polarization reversal easily occurs by the generation of electric charge due to the piezoelectric effect or the pyroelectric effect. Due to the occurrence of polarization reversal, the piezoelectricity may be decreased, which may also increase the insertion loss of the elastic wave device.

SUMMARY OF THE INVENTION

Accordingly, preferred embodiments of the present invention provide an elastic wave device in which polarization reversal is less likely to occur in a piezoelectric substrate so as to significantly reduce or prevent an increase in the insertion loss.

According to a broad aspect of various preferred embodiments of the present invention, an elastic wave device includes a piezoelectric substrate, first and second interdigital transducer electrodes, and a plurality of electrode lands. The piezoelectric substrate includes first and second main surfaces which oppose each other and first and second side portions which oppose each other on the first main surface. A direction of a polarization axis of the piezoelectric substrate is inclined with respect to a direction normal to the first main surface. The first and second interdigital transducer electrodes are disposed on the first main surface of the piezoelectric substrate and each include first and second busbars which oppose each other, a plurality of first electrode fingers, and a plurality of second electrode fingers. One end of each of the plurality of first electrode fingers is connected to the first busbar. One end of each of the plurality of second electrode fingers is connected to the second busbar. The plurality of electrode lands are disposed on the first main surface of the piezoelectric substrate and are each electrically connected to a corresponding one of the first and second interdigital transducer electrodes. The first and second side portions of the piezoelectric substrate extend in a direction perpendicular or substantially perpendicular to the direction of the polarization axis and to the direction normal to the first main surface. A length of the piezoelectric substrate along the direction of the polarization axis at the first side portion is shorter than a length of the piezoelectric substrate along the direction of the polarization axis at the second side portion. The first interdigital transducer electrode is located at a position closer to the first side portion than the second interdigital transducer electrode in an extending direction of the plurality of first and second electrode fingers of the first interdigital transducer electrode. The plurality of electrode lands include a first electrode land and a second electrode land. The first electrode land is connected to the first busbar of the first interdigital transducer electrode without having the second interdigital transducer electrode interposed therebetween. The second electrode land is different from the first electrode land and is at the same potential as the first busbar of the first interdigital transducer electrode.

According to a specific aspect of various preferred embodiments of the present invention, the second electrode land may be connected to the first busbar of the first interdigital transducer electrode without having the second interdigital transducer electrode interposed therebetween. With this configuration, electric charge generated near the first side portion of the piezoelectric substrate is more easily transferred to the outside. Accordingly, polarization reversal is even less likely to occur in the piezoelectric substrate, thus making it possible to further significantly reduce or prevent an increase in the insertion loss.

According to another specific aspect of various preferred embodiments of the present invention, the first electrode land and the second electrode land may be connected to a signal potential of the first interdigital transducer electrode.

According to another specific aspect of various preferred embodiments of the present invention, the second electrode land may not be directly connected to the first busbar of the first interdigital transducer electrode.

According to another specific aspect of various preferred embodiments of the present invention, the first electrode land and the second electrode land may be connected to a ground potential.

According to another specific aspect of various preferred embodiments of the present invention, the first busbar of the first interdigital transducer electrode may be interposed between the plurality of first and second electrode fingers of the first interdigital transducer electrode and the first side portion of the piezoelectric substrate. With this configuration, electric charge generated near the first side portion is less likely to reach the portion where the first and second electrode fingers of the first interdigital transducer electrode are disposed. Hence, it is less likely that the piezoelectricity at the portion where elastic waves of the first interdigital transducer electrode are excited will be decreased, thus making it possible to effectively significantly reduce or prevent an increase in the insertion loss.

According to another specific aspect of various preferred embodiments of the present invention, the elastic wave device may further include a plurality of connecting lines that connect the first and second interdigital transducer electrodes and the plurality of electrode lands with each other. Among the plurality of connecting lines, the connecting line that connects the first busbar of the first interdigital transducer electrode and the first electrode land with each other may be located at a position closest to the first side portion of the piezoelectric substrate. With this configuration, electric charge generated near the first side portion of the piezoelectric substrate is more easily transferred to the outside.

According to another specific aspect of various preferred embodiments of the present invention, the elastic wave device may further include a plurality of bumps that are each disposed on a corresponding one of the plurality of electrode lands. With this configuration, the elastic wave device is able to be electrically connected to an external source by using the plural bumps.

According to preferred embodiments of the present invention, it is possible to provide an elastic wave device in which polarization reversal is less likely to occur in a piezoelectric substrate so as to significantly reduce or prevent an increase in the insertion loss.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 is a schematic plan view of an elastic wave device according to a third preferred embodiment of the present invention.

DETAILED DESCRIPTION OF THE PREFERRED EMBODIMENTS

Preferred embodiments of the present invention will be described below with reference to the accompanying drawings.

The preferred embodiments described below are only examples. Note that, among the different preferred embodiments, portions, features or elements of one preferred embodiment may be replaced by or combined with that of another preferred embodiment.

Figure 1:
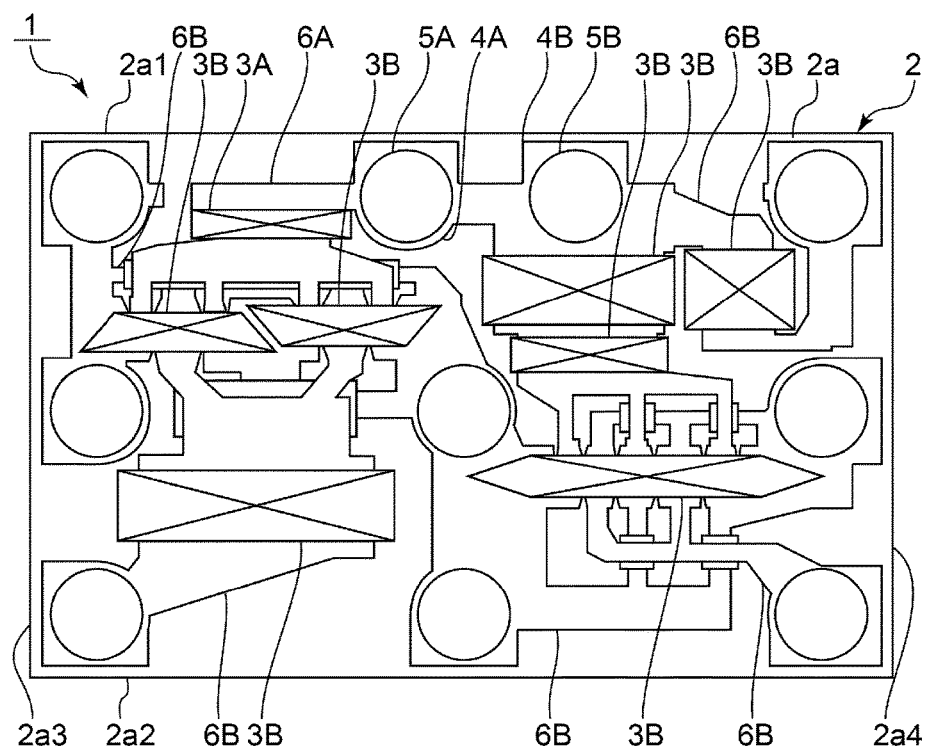
FIG. 1 is a schematic plan view of an elastic wave device according to a first preferred embodiment of the present invention.

FIG. 1 is a schematic plan view of an elastic wave device 1 according to a first preferred embodiment of the present invention.

The elastic wave device 1 includes a piezoelectric substrate 2. The piezoelectric substrate 2 includes a first main surface 2a and a second main surface 2b (shown in FIG. 2) opposing each other. The first and second main surfaces 2a and 2b preferably are rectangular or substantially rectangular. The first main surface 2a include first through fourth side portions 2a1 through 2a4. The piezoelectric substrate 2 is made of a piezoelectric single crystal, such as $LiNbO_3$ and $LiTaO_3$. Alternatively, the piezoelectric substrate 2 may be made of piezoelectric ceramics.

Figure 2:
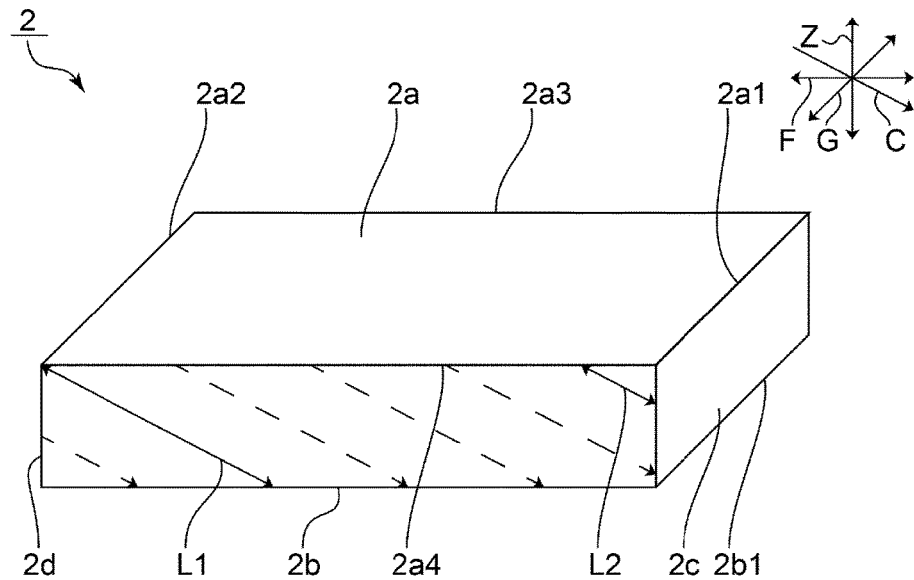
FIG. 2 is a perspective view of a piezoelectric substrate according to the first preferred embodiment of the present invention.

FIG. 2 is a perspective view of the piezoelectric substrate 2. The piezoelectric substrate 2 has a thickness along a direction Z (hereinafter referred to as the "thickness direction Z"), which is parallel or substantially parallel with a direction normal to the first main surface 2a. The piezoelectric substrate 2 has a polarization axis along a direction C (hereinafter referred to as the "polarization axis direction C"), which is inclined with respect to the direction normal to the first main surface 2a. The first and second side portions 2a1 and 2a2 of the piezoelectric substrate 2 extend in a direction perpendicular or substantially perpendicular to the thickness direction Z and the polarization axis direction C. The length of the piezoelectric substrate 2 along the thickness direction Z is uniform at any position of the first main surface 2a. In contrast, the length of the piezoelectric substrate 2 along the polarization axis direction C varies depending on the position of the first main surface 2a. More specifically, the length of the piezoelectric substrate 2 along the polarization axis direction C is indicated by L, and in this case, the length L at the first side portion 2a1 is shorter than the length L at the second side portion 2a2. This will be discussed in detail later.

Referring back to FIG. 1, on the first main surface 2a of the piezoelectric substrate 2, a first IDT electrode 3A and plural second IDT electrodes 3B are disposed. In the first preferred embodiment, all the IDT electrodes, except for the first IDT electrode 3A, disposed on the first main surface 2a are the plural second IDT electrodes 3B. The first IDT electrode 3A will be described below in detail with reference to FIG. 3.

Figure 3:
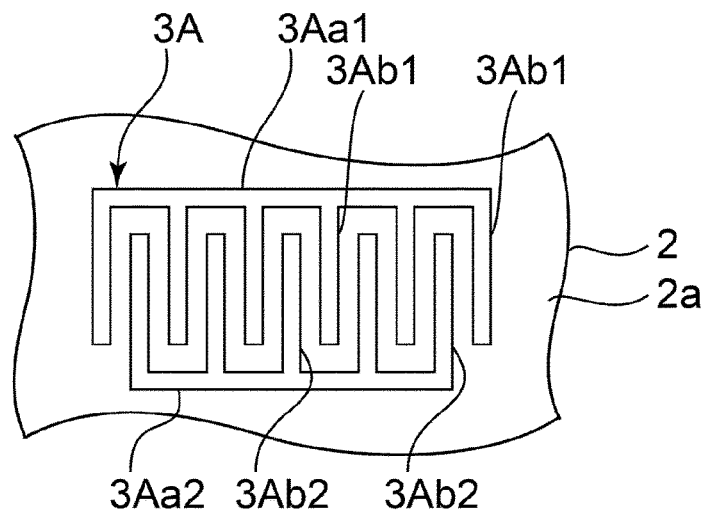
FIG. 3 is a cutaway plan view partially illustrating the electrode structure of a first IDT electrode according to the first preferred embodiment of the present invention.

FIG. 3 is a cutaway plan view partially illustrating the electrode structure of the first IDT electrode 3A in the first preferred embodiment. In FIG. 3, lines connected to the first IDT electrode 3A are not shown.

In FIG. 1, the first IDT electrode 3A is schematically represented in the shape of a rectangle with diagonal lines. As shown in FIG. 3, however, the first IDT electrode 3A includes first and second busbars 3Aa1 and 3Aa2 opposing each other, and also includes plural first and second electrode fingers 3Ab1 and 3Ab2. One end of each of the plural first electrode fingers 3Ab1 is connected to the first busbar 3Aa1. One end of each of the plural second electrode fingers 3Ab2 is connected to the second busbar 3Aa2. The plural first electrode fingers 3Ab1 and the plural second electrode fingers 3Ab2 are fit into each other in an interdigitated arrangement. The first busbar 3Aa1 is disposed between the plural first and second electrode fingers 3Ab1 and 3Ab2 and the first side portion 2a1 of the piezoelectric substrate 2 shown in FIG. 1.

By applying a voltage to the first IDT electrode 3A, elastic waves are excited. A reflector may be disposed on each side of the first IDT electrode 3A in the propagating direction of elastic waves. In this manner, a one-port elastic wave resonator is provided.

Figure 4:
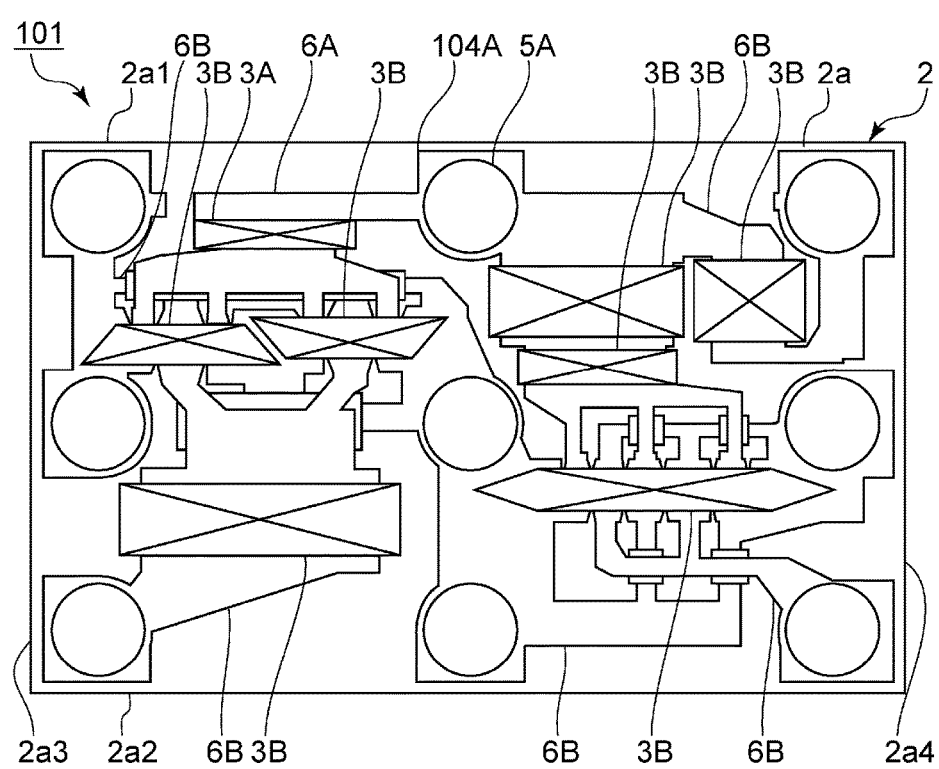
FIG. 4 is a schematic plan view of an elastic wave device of a comparative example.
Figure 5:
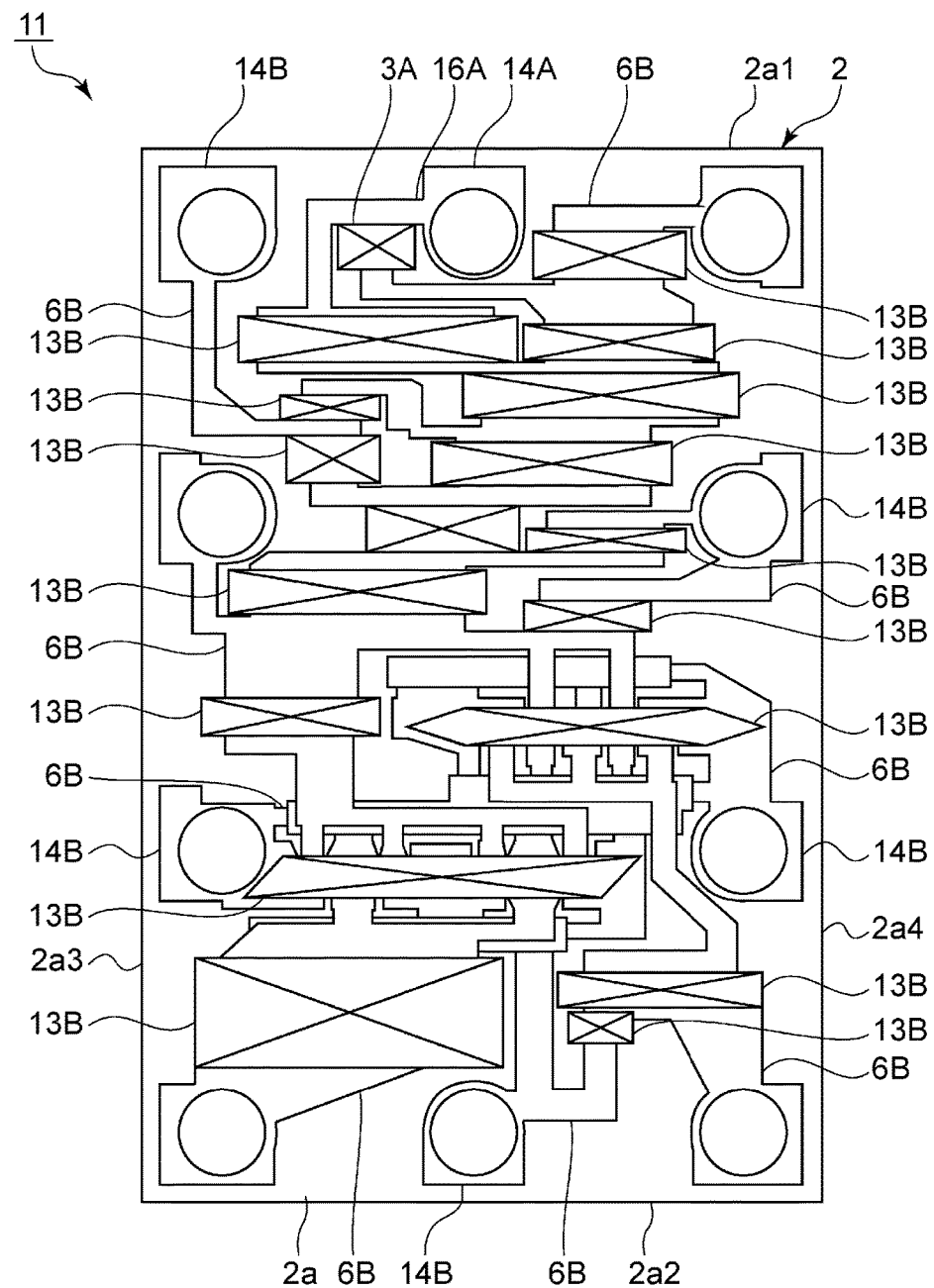
FIG. 5 is a schematic plan view of an elastic wave device according to a second preferred embodiment of the present invention.

Each of the second IDT electrodes 3B, as well as the first IDT electrode 3A, includes first and second busbars and plural first and second electrode fingers. In FIGS. 4 through 6, the first IDT electrode and the plural second IDT electrodes are also schematically represented in the shape of a rectangle or another polygon with diagonal lines.

Referring back to FIG. 1, the first IDT electrode 3A is located closer to the first side portion 2a1 of the piezoelectric substrate 2 than the plural second IDT electrodes 3B in the extending direction of the first and second electrode fingers 3Ab1 and 3Ab2 of the first IDT electrode 3A.

On the first main surface 2a of the piezoelectric substrate 2, plural electrode lands are provided. Each of the electrode lands is electrically connected to a corresponding one of the first and second IDT electrodes 3A and 3B. The plural electrode lands include a first electrode land 4A and a second electrode land 4B, which is different from the first electrode land 4A. The first and second electrode lands 4A and 4B are disposed along the first side portion 2a1 of the piezoelectric substrate 2. The first electrode land 4A is connected to the first busbar 3Aa1 of the first IDT electrode 3A without having the second IDT electrode 3B interposed therebetween. In the first preferred embodiment, the second electrode land 4B is also connected to the first busbar 3Aa1 of the first IDT electrode 3A without having the second IDT electrode 3B interposed therebetween.

On the first main surface 2a of the piezoelectric substrate 2, plural connecting lines 6A and 6B are disposed. The connecting lines 6A and 6B respectively connect the first and second IDT electrodes 3A and 3B and the associated electrode lands with each other.

The first and second electrode lands 4A and 4B may be connected to the second busbar 3Aa2 of the first IDT electrode 3A, which is disposed farther separated from the first side portion 2a1.

In the first preferred embodiment, the first and second electrode lands 4A and 4B are connected to the signal potential of the first IDT electrode 3A. Alternatively, the first and second electrode lands 4A and 4B may be connected to a ground potential.

Bumps 5A and 5B are provided on the first and second lands 4A and 4B, respectively. A bump is also provided on each of the other plural electrode lands. The elastic wave device 1 is electrically connected to an external source by using these bumps. Alternatively, the elastic wave device 1 may be connected to an external source by using another component other than bumps.

Some of the unique characteristics of the first preferred embodiment include:

(1) that the first IDT electrode 3A is located at a position near the first side portion 2a1 at which the length L of the piezoelectric substrate 2 along the polarization axis direction C is short; and (2) that the first electrode land 4A connected to the first IDT electrode 3A and the second electrode land 4B which is at the same potential as the first busbar 3Aa1 of the first IDT electrode 3A are provided. With this configuration, polarization reversal is less likely to occur in the piezoelectric substrate 2, which makes it possible to significantly reduce or prevent an increase in the insertion loss. This will be explained below more specifically by using a comparative example.

FIG. 4 is a schematic plan view of an elastic wave device 101 of a comparative example.

In the elastic wave device 101, the first busbar of the first IDT electrode 3A is connected to a first electrode land 104A. The electrode land of the same potential as that of the first busbar is only the first electrode land 104A. Apart from these points, the configuration of the elastic wave device 101 is similar to that of the elastic wave device 1 of the first preferred embodiment.

As the electric field, stress, and heat acting on a piezoelectric body is greater, polarization reversal is likely to occur. This will be explained more specifically. Electric charge is generated in the piezoelectric substrate due to the piezoelectric effect or the pyroelectric effect. In this case, due to the generation of electric charge, an electric field may be applied to the piezoelectric substrate in the direction opposite to the polarization axis direction. When the intensity of this electric field exceeds the coercive electric field at a portion to which the electric field is applied, polarization reversal occurs.

The coercive electric field in the piezoelectric substrate becomes smaller as the length L of the piezoelectric substrate along the polarization axis direction C is shorter. The portion of the piezoelectric substrate having the shortest length L in the first preferred embodiment and the comparative example will be discussed below with reference to FIG. 2. As described above, the configuration of the piezoelectric substrate 2 of the comparative example is similar to that of the first preferred embodiment.

As shown in FIG. 2, the piezoelectric substrate 2 includes first and second side surfaces 2c and 2d respectively extending from the first and second side portions 2a1 and 2a2 in the thickness direction Z. The second main surface 2b of the piezoelectric substrate 2 includes a fifth side portion 2b1 which opposes the first side portion 2a1 in the thickness direction Z.

In FIG. 2, the polarization axis of the piezoelectric substrate 2 is indicated by the dashed arrows. In the first preferred embodiment, the base end of the polarization axis is positioned near the first main surface 2a and the terminating end thereof is positioned near the second main surface 2b. The polarization axis direction C is not particularly restricted as long as it is inclined with respect to the direction normal to the first main surface 2a.

In the piezoelectric substrate 2, the above-described length L is the longest at a portion in which the base end of the polarization axis is located on the first main surface 2a and the terminating end thereof is located on the second main surface 2b. Accordingly, the length L at the second side portion 2a2 is the longest length. Here, the length L at the second side portion 2a2 is set to be the length L1.

In contrast, in the piezoelectric substrate 2, at a portion in which the base end of the polarization axis is located on the first main surface 2a and the terminating end thereof is located on the first side surface 2c, the length L becomes shorter as the terminating end of the polarization axis approaches the first side portion 2a1 from the fifth side portion 2b1. The length L at a portion in which the terminating end of the polarization axis is located at the first side surface 2c and at a position other than the fifth side portion 2b1 is represented by the length L2. In this case, the length L2 is shorter than the length L1. The length L2 becomes shorter as the terminating end of the polarization axis approaches the first side portion 2a1. If the piezoelectric substrate 2 has an ideal rectangular parallelepiped shape, the length L at the first side portion 2a1 becomes 0. In the vicinity of the first side portion 2a1, the length L2 is almost 0. Although the length L at the first side portion 2a1 is ideally 0, it may be a length which is almost 0. In a preferred embodiment of the present invention, the length of the piezoelectric substrate along the polarization axis direction at the first side portion, which is compared with the length L1, includes a length of 0. Accordingly, the length L of the piezoelectric substrate 2 is the shortest at the first side portion 2a1.

If the piezoelectric substrate 2 has a rectangular or substantially rectangular parallelepiped shape, as shown in FIG. 2, the direction in which the polarization axis direction C is projected on the first main surface 2a when viewing the piezoelectric substrate 2 facing the first main surface 2a is assumed as a projecting direction F of the polarization axis (hereinafter referred to as the "polarization axis projecting direction F"), and the direction perpendicular or substantially perpendicular to the polarization axis projecting direction F in the plane of the first main surface 2a is assumed as a direction G (hereinafter referred to as the "perpendicular or substantially perpendicular projecting direction G"). In this case, the first and second side portions 2a1 and 2a2 extend in parallel or substantially parallel with the perpendicular or substantially perpendicular projecting direction G. In other words, it may not be necessary that the first and second side portions 2a1 and 2a2 extend exactly in parallel with the perpendicular or substantially perpendicular projecting direction G. Instead, the first and second side portions 2a1 and 2a2 may be inclined with respect to the perpendicular or substantially perpendicular projecting direction G as long as the angle of incline is within about ±5°, for example.

If the first and second side portions 2a1 and 2a2 are inclined with respect to the perpendicular or substantially perpendicular projecting direction G, the length L along the polarization axis direction may be considered in the following manner. If the direction of a line which connects the first and second side portions 2a1 and 2a2 with each other is the longitudinal direction, the dimensions of components of the length L in the longitudinal direction may be considered as the above-described lengths L1 and L2.

Polarization reversal is more likely to occur in a portion of a piezoelectric body at which the polarization axis is shorter than that at which the polarization axis is longer. This means that the coercive electric field is small at the first side portion 2a1 of the piezoelectric substrate 2. Accordingly, in the elastic wave device 101, polarization reversal is likely to occur in the first side portion 2a1. Similarly, the coercive electric field is small in the vicinity of the first side portion 2a1 on the first main surface 2a, and thus, polarization reversal is likely to occur in this portion. In the portion of the piezoelectric substrate 2 where the first IDT electrode 3A is disposed, polarization reversal may also occur starting from the first side portion 2a1. Since the first IDT electrode 3A is located closer to the first side portion 2a1 than the second IDT electrodes 3B, the piezoelectricity at this portion may be decreased, which may also increase the insertion loss of the elastic wave device 101. In particular, the edge of the piezoelectric substrate is vulnerable to stress and heat.

In contrast, as shown in FIG. 1, the elastic wave device 1 of the first preferred embodiment includes the first and second electrode lands 4A and 4B. The first and second electrode lands 4A and 4B are connected in parallel with each other to the signal potential of the first IDT electrode 3A via the bumps 5A and 5B, respectively. Accordingly, the electric resistance between the first busbar 3Aa1 of the first IDT electrode 3A and the signal potential is low, so that electric charge generated near the portion where the first IDT electrode 3A is disposed is able to be easily transferred to the outside. Additionally, heat dissipation is enhanced, and thus, the generation of electric charge due to the pyroelectric effect is also less likely to occur. Accordingly, polarization reversal is less likely to occur in the portion of the piezoelectric substrate 2 where the first IDT electrode 3A is disposed. As a result, the piezoelectricity is less likely to decrease, which makes it possible to significantly reduce or prevent an increase in the insertion loss.

Additionally, the first busbar 3Aa1 of the first IDT electrode 3A connected to the first electrode land 4A is interposed between the first and second electrode fingers 3Ab1 and 3Ab2 of the first IDT electrode 3A and the first side portion 2a1 of the piezoelectric substrate 2. The first busbar 3Aa1 is connected to the first electrode land 4A via the connecting line 6A.

Accordingly, electric charge generated near the first side portion 2a1 is transferred to the outside via the first busbar 3Aa1 and the connecting line 6A, which are located closer to the first side portion 2a1 than the first and second electrode fingers 3Ab1 and 3Ab2. Thus, electric charge generated near the first side portion 2a1 is less likely to reach the portion where the first and second electrode fingers 3Ab1 and 3Ab2 are disposed. Hence, it is less likely that the piezoelectricity at the portion where elastic waves of the first IDT electrode 3A are excited will be decreased, thus making it possible to effectively significantly reduce or prevent an increase in the insertion loss.

In this manner, the first IDT electrode 3A is able to be located close to the first side portion 2a1 without incurring an increase in the insertion loss. It is thus possible to reduce the size of the elastic wave device 1.

The plural second IDT electrodes 3B are spaced farther from the first side portion 2a1 than the first IDT electrode 3A. Because of this configuration, polarization reversal is less likely to occur at the portion where the second IDT electrodes 3B are disposed.

In the first preferred embodiment, only one second electrode land 4B is connected to the first busbar 3Aa1 of the first IDT electrode 3A. However, plural second electrode lands 4B may be connected to the first busbar 3Aa1 of the first IDT electrode 3A without having the second IDT electrode 3B interposed therebetween. In this case, polarization reversal is even less likely to occur in the first side portion 2a1 of the piezoelectric substrate 2.

FIG. 5 is a schematic plan view of an elastic wave device 11 according to a second preferred embodiment of the present invention.

The second preferred embodiment is different from the first preferred embodiment in that the elastic wave device 11 includes plural second electrode lands 14B and first and second electrode lands 14A and 14B are connected to a ground potential, and that a connecting line 16A which connects the first electrode land 14A and the first IDT electrode 3A is located at a position closest to the first side portion 2a1 of the piezoelectric substrate 2. The electrode structure of the elastic wave device 11 other than the above-described points is also different from that of the elastic wave device 1 of the first preferred embodiment.

More specifically, the number and the positional arrangement of second IDT electrodes 13B are different from those of the first preferred embodiment, and the positional arrangement of plural electrode lands is also different from that of the first preferred embodiment. The plural second electrode lands 14B are not directly connected to the first busbar 3Aa1 of the first IDT electrode 3A, and instead, they are connected to the busbars of the respective second IDT electrodes 13B. As in the first preferred embodiment, the first IDT electrode 3A is located closer to the first side portion 2a1 of the piezoelectric substrate 2 than the plural second IDT electrodes 13B in the extending direction of the plural first and second electrode fingers 3Ab1 and 3Ab2 of the first IDT electrode 3A.

As discussed above, the first and second electrode lands 14A and 14B are connected to the ground potential. Accordingly, the first and second electrode lands 14A and 14B are connected in parallel with each other to the outside. Thus, the electric resistance between the first electrode land 14A and the ground potential is low, so that electric charge generated near the first side portion 2a1 is able to be easily transferred to the outside. As a result, polarization reversal is less likely to occur in the portion where the first IDT electrode 3A of the piezoelectric substrate 2 is disposed, thus making it possible to significantly reduce or prevent an increase in the insertion loss.

Among plural connecting lines 16A and 6B, the connecting line 16A is located at a position closest to the first side portion 2a1 of the piezoelectric substrate 2. Accordingly, electric charge generated near the first side portion 2a1 is even less likely to reach the portion where the first and second electrode fingers 3Ab1 and 3Ab2 are disposed. It is thus possible to further significantly reduce or prevent an increase in the insertion loss.

FIG. 6 is a schematic plan view of an elastic wave device 21 according to a third preferred embodiment of the present invention.

The third preferred embodiment is different from the second preferred embodiment in that, in the elastic wave device 21, one of second electrode lands 14B is connected to the first busbar 3Aa1 of the first IDT electrode 3A without having the second IDT electrode 13B interposed therebetween. Apart from this point, the configuration of the elastic wave device 21 is similar to that of the elastic wave device 11 of the second preferred embodiment.

The first and second electrode lands 14A and 14B are connected to the first busbar 3Aa1 of the first IDT electrode 3A via a connecting line 26A. In the third preferred embodiment, the electric resistance between the second electrode land 14B and the ground potential, as well as that between the first electrode land 14A and the ground potential, is small. It is thus possible to more easily transfer electric charge generated near the first side portion 2a1 to the outside. Therefore, it is even less likely that polarization reversal will occur in the portion where the first IDT electrode 3A is disposed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate including first and second main surfaces which oppose each other and first and second side portions which oppose each other on the first main surface, a direction of a polarization axis of the piezoelectric substrate being inclined with respect to a direction normal to the first main surface;
first and second interdigital transducer electrodes that are disposed on the first main surface of the piezoelectric substrate and that each include first and second busbars which oppose each other, a plurality of first electrode fingers, and a plurality of second electrode fingers, one end of each of the plurality of first electrode fingers being connected to the first busbar, one end of each of the plurality of second electrode fingers being connected to the second busbar; and
a plurality of electrode lands that are disposed on the first main surface of the piezoelectric substrate and that are each electrically connected to a corresponding one of the first and second interdigital transducer electrodes; wherein
the first and second side portions of the piezoelectric substrate extend in a direction perpendicular or substantially perpendicular to the direction of the polarization axis and to the direction normal to the first main surface, and a length of the piezoelectric substrate along the direction of the polarization axis at the first side portion is shorter than a length of the piezoelectric substrate along the direction of the polarization axis at the second side portion;
the first interdigital transducer electrode is located at a position closer to the first side portion than the second interdigital transducer electrode in an extending direction of the plurality of first and second electrode fingers of the first interdigital transducer electrode; and
the plurality of electrode lands include a first electrode land and a second electrode land, the first electrode land being connected to the first busbar of the first interdigital transducer electrode without having the second interdigital transducer electrode interposed therebetween, the second electrode land being different from the first electrode land and being at a same potential as the first busbar of the first interdigital transducer electrode.

2. The elastic wave device according to claim 1, wherein the second electrode land is connected to the first busbar of the first interdigital transducer electrode without having the second interdigital transducer electrode interposed therebetween.

3. The elastic wave device according to claim 1, wherein the first electrode land and the second electrode land are connected to a signal potential of the first interdigital transducer electrode.

4. The elastic wave device according to claim 1, wherein the second electrode land is not directly connected to the first busbar of the first interdigital transducer electrode.

5. The elastic wave device according to claim 1, wherein the first electrode land and the second electrode land are connected to a ground potential.

6. The elastic wave device according to claim 1, wherein the first busbar of the first interdigital transducer electrode is interposed between the plurality of first and second electrode fingers of the first interdigital transducer electrode and the first side portion of the piezoelectric substrate.

7. The elastic wave device according to claim 1, further comprising:
a plurality of connecting lines that connect the first and second interdigital transducer electrodes and the plurality of electrode lands with each other; wherein
among the plurality of connecting lines, the connecting line that connects the first busbar of the first interdigital transducer electrode and the first electrode land with each other is located at a position closest to the first side portion of the piezoelectric substrate.

8. The elastic wave device according to claim 1, further comprising a plurality of bumps that are each disposed on a corresponding one of the plurality of electrode lands.

9. The elastic wave device according to claim 1, further comprising a reflector provide on each side of the first interdigital transducer electrode.

10. The elastic wave device according to claim 1, wherein the elastic wave device is a one-port elastic wave resonator.

11. The elastic wave device according to claim 1, wherein the direction of a polarization axis of the piezoelectric substrate is inclined at an angle of about ±5° with respect to a direction normal to the first main surface.

12. The elastic wave device according to claim 6, further comprising a connecting line that connects the first busbar of the first interdigital transducer electrode to the first electrode land.

13. The elastic wave device according to claim 1, wherein plural ones of the second electrode land are connected to the first busbar of the first interdigital transducer electrode terminal without having the second interdigital transducer electrode terminal interposed therebetween.

14. The elastic wave device according to claim 1, wherein plural ones of the second electrode land are connected to busbars of the second interdigital transducer electrode terminals.

15. The elastic wave device according to claim 1, wherein plural ones of the second electrode land are provided, one of the second electrode lands is connected to the first busbar of the first interdigital transducer electrode terminal without having the second interdigital transducer electrode terminal interposed therebetween and another one of the second electrode lands is connected to the busbar of one of the second interdigital transducer electrode terminals.

* * * * *